(12) United States Patent
Qian et al.

(10) Patent No.: US 6,373,022 B2
(45) Date of Patent: *Apr. 16, 2002

(54) PLASMA REACTOR WITH ANTENNA OF COIL CONDUCTORS OF CONCENTRIC HELICES OFFSET ALONG THE AXIS OF SYMMETRY

(75) Inventors: Xue-Yu Qian, Milpitas; Arthur H. Sato, Santa Clara, both of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/742,558

(22) Filed: Dec. 20, 2000

Related U.S. Application Data

(63) Continuation of application No. 08/886,240, filed on Jun. 30, 1997.

(51) Int. Cl.$^7$ ................................................ B23K 10/00
(52) U.S. Cl. .................................. 219/121.43; 219/121.4
(58) Field of Search .......................... 219/121.4, 121.41, 219/121.43, 121.52; 118/723 R, 723 I; 204/298.12, 298.37, 298.38; 156/345, 643.1, 646.1

(56) References Cited

U.S. PATENT DOCUMENTS

| | | |
|---|---|---|
| 4,795,529 A | 1/1989 | Kawasaki et al. |
| 4,842,683 A | 6/1989 | Cheng et al. |
| 4,844,775 A | 7/1989 | Keeble |
| 4,872,947 A | 10/1989 | Wang et al. |
| 4,948,458 A | 8/1990 | Ogle |
| 4,992,665 A | 2/1991 | Mohl |
| 5,122,251 A | 6/1992 | Campbell et al. |
| 5,194,731 A | 3/1993 | Turner |
| 5,234,529 A | 8/1993 | Johnson |
| 5,277,751 A | 1/1994 | Ogle |
| 5,280,154 A | 1/1994 | Cuomo et al. |
| 5,401,350 A | 3/1995 | Patrick et al. |
| 5,558,722 A | 9/1996 | Okumura et al. |
| 5,874,704 A | 2/1999 | Gates |
| 5,919,382 A | 7/1999 | Qian et al. |

FOREIGN PATENT DOCUMENTS

| | | |
|---|---|---|
| EP | 0 379 828 | 8/1990 |
| EP | 0 413 282 | 2/1991 |
| EP | 0 520 519 | 12/1992 |
| EP | 0 552 491 | 7/1993 |
| EP | 0 596 551 | 5/1994 |
| EP | 0 710 055 | 5/1996 |
| EP | 0 727 807 | 8/1996 |
| EP | 0 727 923 | 8/1996 |
| EP | 0 833 367 | 4/1998 |
| GB | 2 231 197 | 11/1990 |
| WO | 91/1034 | 7/1991 |

Primary Examiner—Teresa Walberg
(74) Attorney, Agent, or Firm—Michaelson and Wallace

(57) ABSTRACT

The invention is embodied in a coil antenna for radiating RF power supplied by an RF source into a vacuum chamber, the coil antenna including plural helical conductors each having a first end and a second end, the first ends being adapted for connection to a first common RF potential, the second ends being adapted for connection to a second common RF potential, each of the plural conductors being wound about a common axis of helical symmetry, each of the second ends being spaced substantially equally from the axis and from each other.

25 Claims, 13 Drawing Sheets

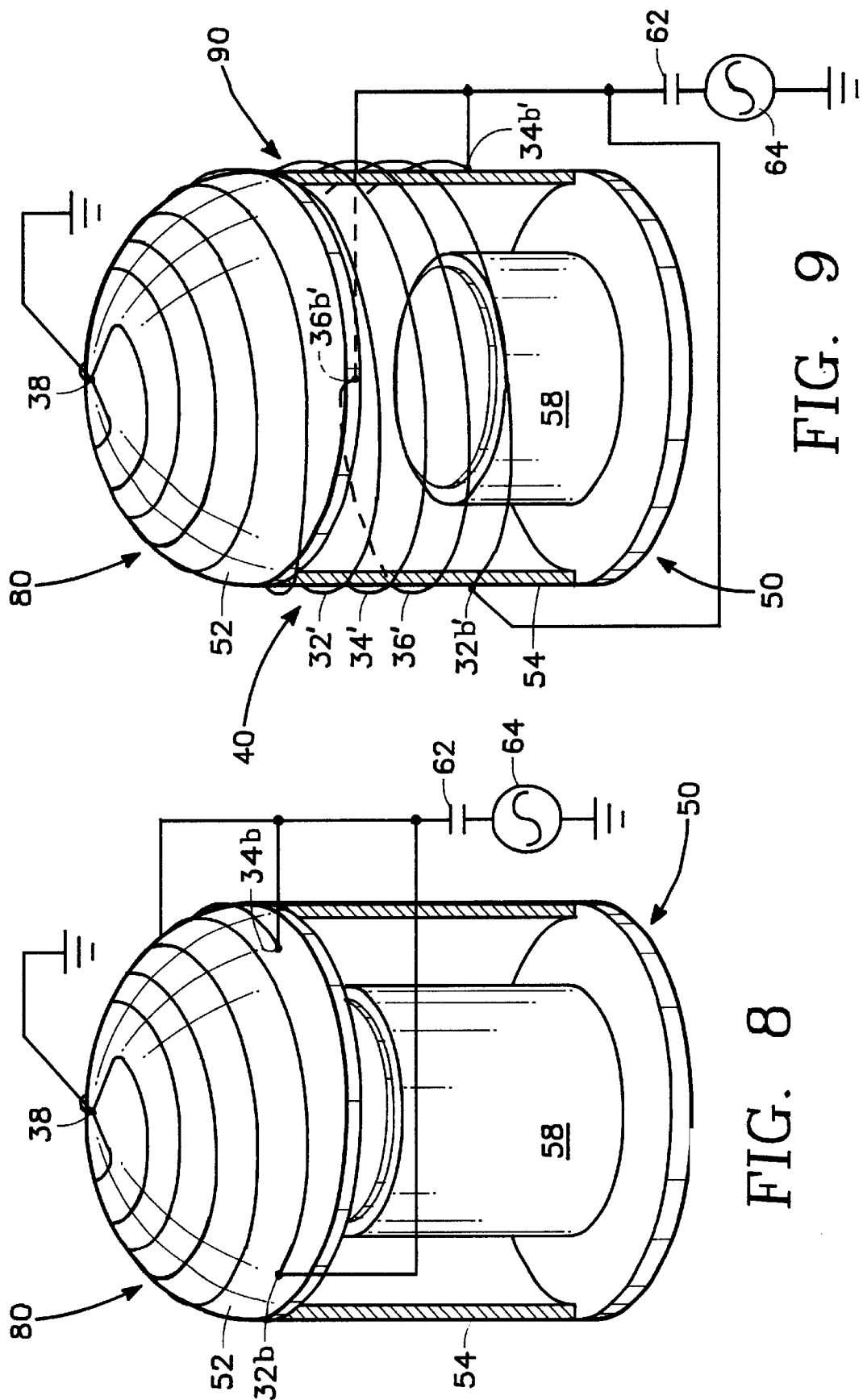

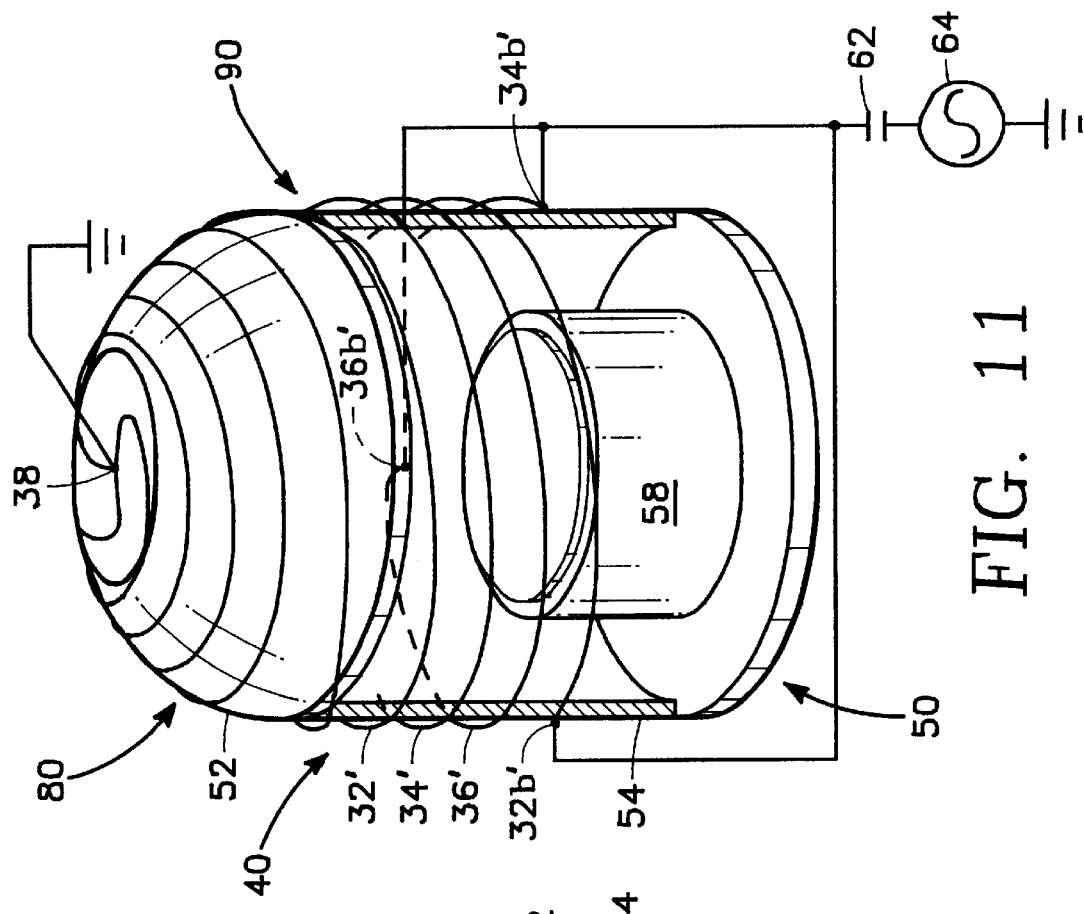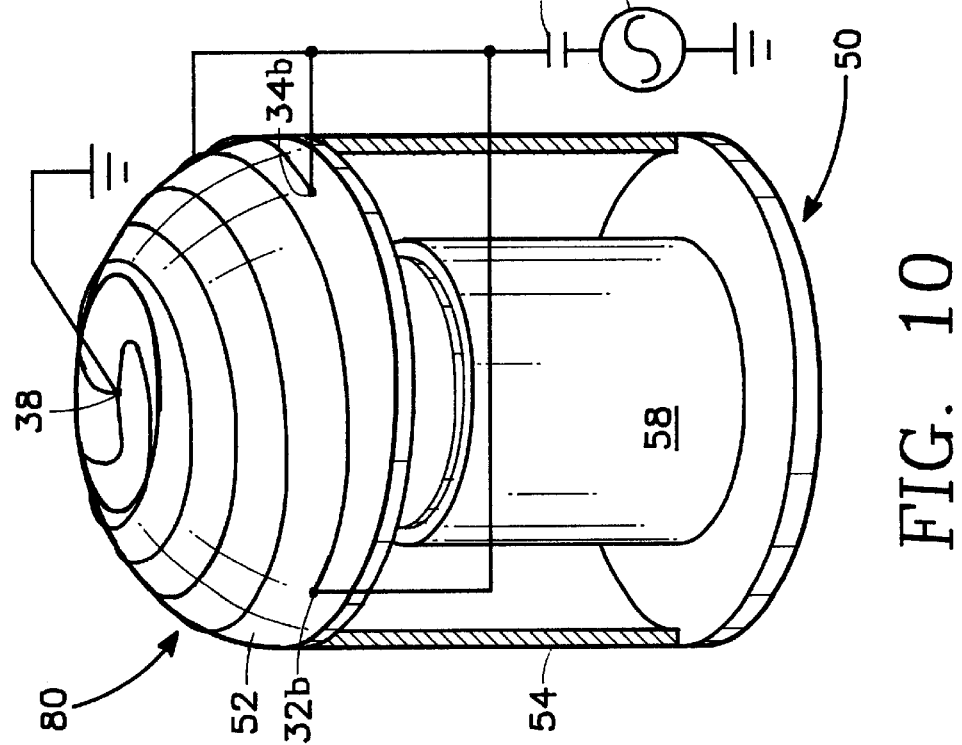

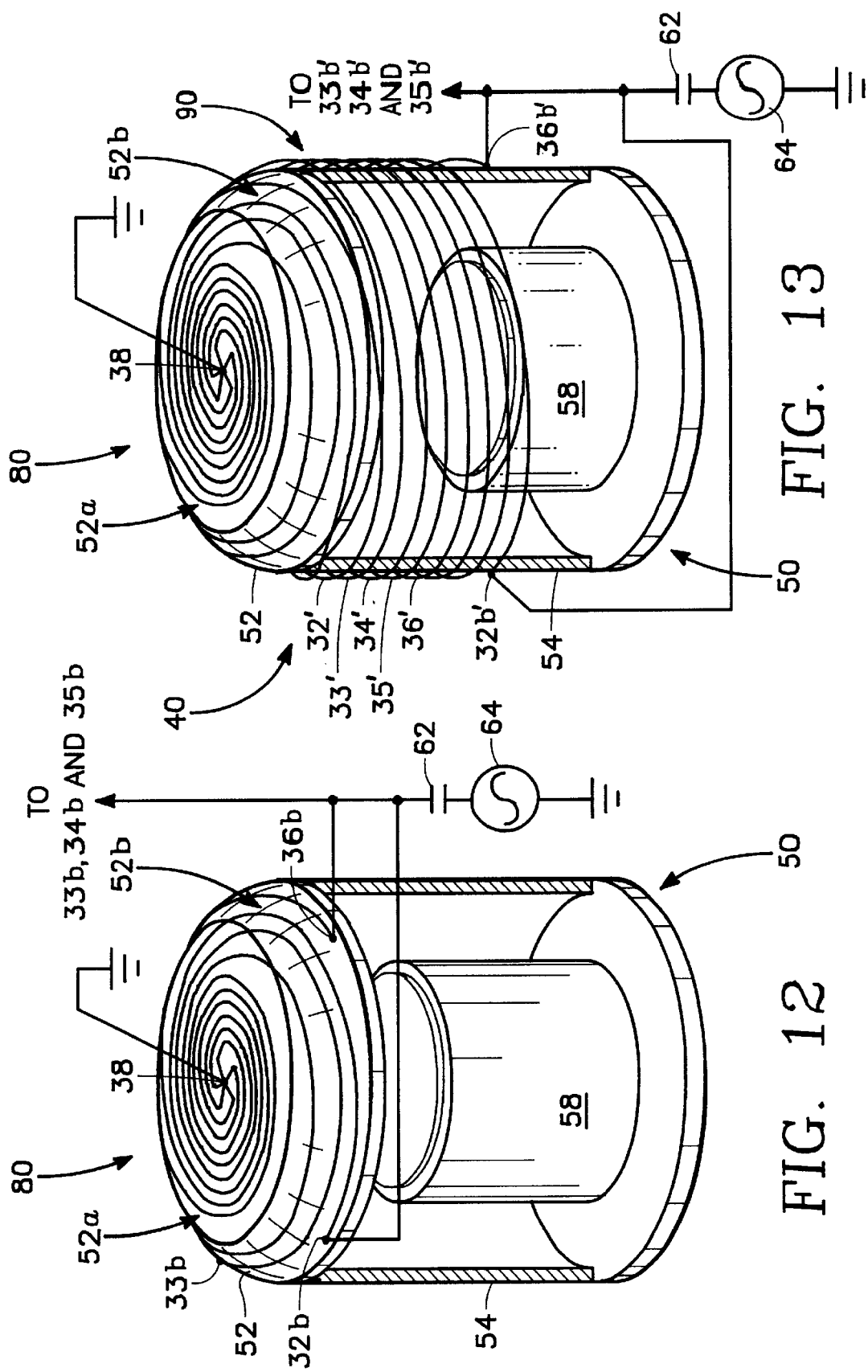

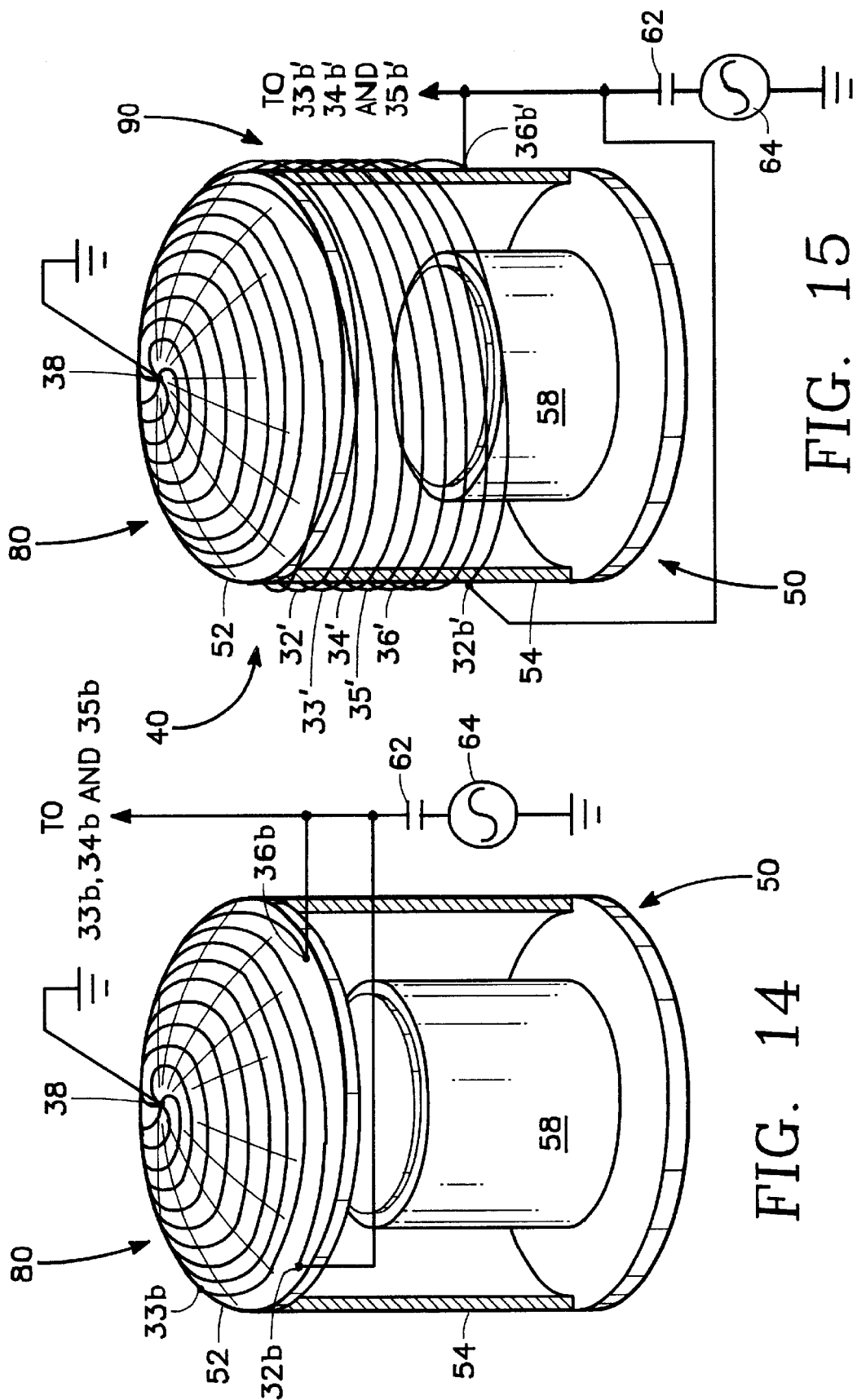

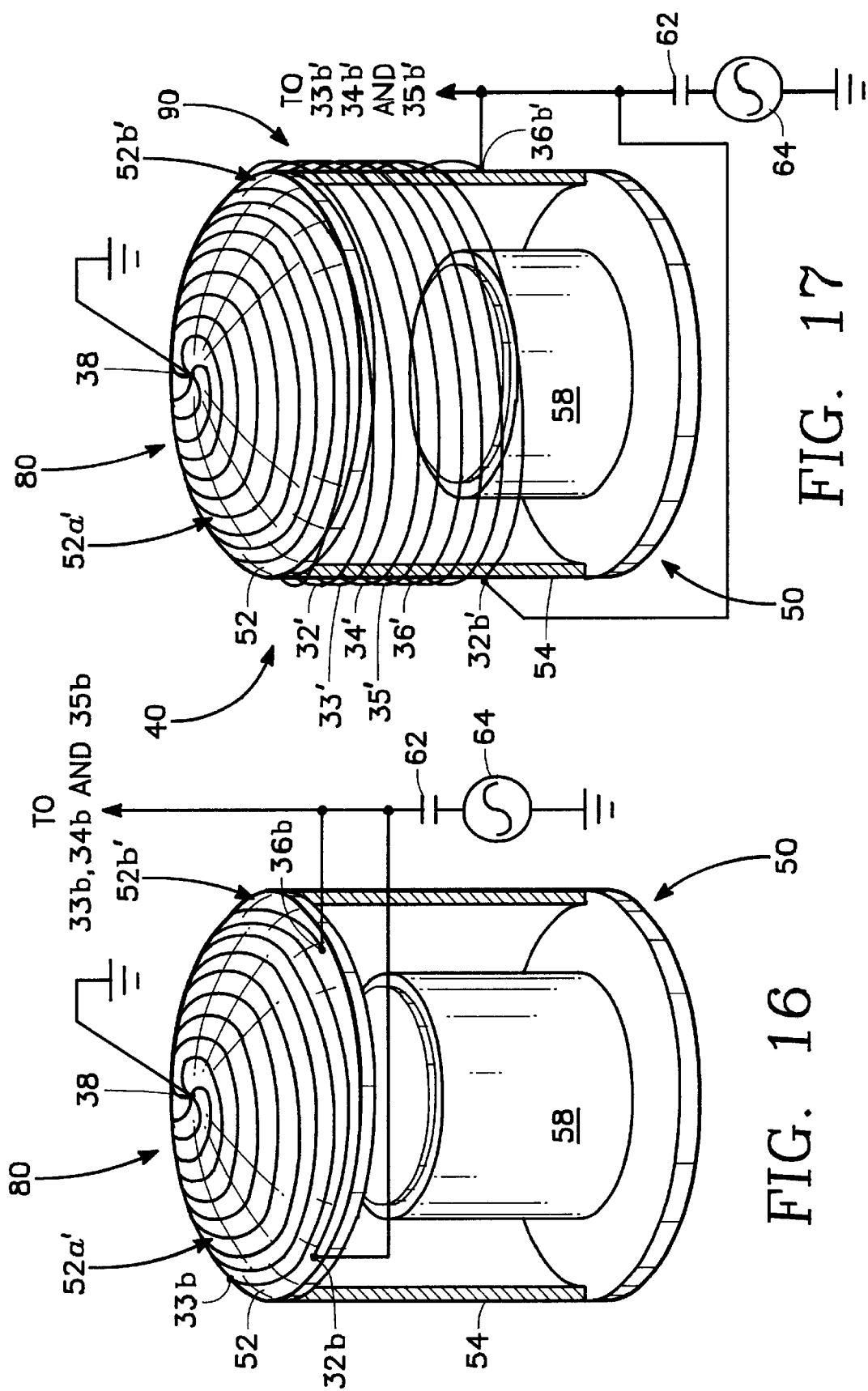

PLASMA REACTOR WITH ANTENNA OF COIL CONDUCTORS OF CONCENTRIC HELICES OFFSET ALONG THE AXIS OF SYMMETRY

CROSS REFERENCE TO RELATED APPLICATIONS

This is a continuation of application Ser. No. 08/886,240, pending filed Jun. 30, 1997. This application contains subject matter related to the following co-pending, commonly assigned U.S. applications: U.S. application Ser. No. 09/742,051, pending, filed Dec. 20,2000 entitled PLASMA REACTOR WITH COIL ANTENNA OF PLURAL HELICAL CONDUCTORS WITH EQUALLY SPACED ENDS, by Qian, et al.; U.S. application Ser. No. 09/742,951, pending, filed Dec. 20, 2000 entitled PLASMA REACTOR WITH COIL ANTENNA OF CONCENTRICALLY SPIRAL CONDUCTORS WITH ENDS IN COMMON REGIONS, by Qian, et al.; U.S. application Ser. No. 09/742,988, pending filed Dec. 20, 2000 entitled PLASMA REACTOR WITH COIL ANTENNA OF INTERLEAVED CONDUCTORS, by Qian, et al.

BACKGROUND OF THE INVENTION

1. Technical Field

The invention is related to fabrication of microelectronic integrated circuits with a inductively coupled RF plasma reactor and particularly to such reactors having coiled RF antennas providing a highly uniform plasma distribution.

2. Background Art

Inductively coupled plasma reactors are employed where high density inductively coupled plasmas are desired for processing semiconductor wafers. Such processing may be etching, chemical vapor deposition and so forth. Inductively coupled reactors typically employ a coiled antenna wound around or near a portion of the reactor chamber and connected to an RF power source. In order to provide a uniform etch rate or deposition rate across the entire surface of a wafer, the plasma density provided by the coiled antenna must be *uniform across the surface of the semiconductor wafer. One attempt to provide such a uniform field is to wind the coiled antenna in a flat disk parallel to overlying the wafer, as disclosed in U.S. Pat. No. 4,948,458 to Ogle. This concept is depicted in FIG. 1.

One problem with the flat coiled antenna of FIG. 1 is that there is a large potential difference between the center of the antenna and the circumferential edge thereof, with the result that the plasma can have a high ion density or "hot spot" over the center of the wafer and a lower ion density at the wafer periphery. This in turn causes the etch rate—or deposition rate—to be nonuniform across the wafer surface. One way of ameliorating this problem is to limit the power applied to the antenna coil to a few hundred watts so as to minimize the plasma non-uniformity. This approach is not completely satisfactory because it limits the etch rate (or deposition rate), thereby reducing throughput or productivity of the reactor, and moreover does not solve the problem of process non-uniformity across the wafer surface.

Another problem with inductively coupled reactors is that any high voltage applied to the antenna coil leads to capacitive coupling of RF power to the plasma. In other words, capacitive coupling of RF power from the coiled antenna to the plasma increases with the voltage on the coiled antenna. Such capacitive coupling can increase the ion kinetic energy which makes it difficult for the user to precisely control ion kinetic energy and thereby control sputtering rate or etch rate. Capacitive coupling is particularly pronounced in the flat disk coil antenna of FIG. 1.

Therefore, there is a need for an inductively coupled plasma reactor having a coiled antenna which provides a highly uniform plasma across the wafer surface at high power with only minimal capacitive coupling.

SUMMARY OF THE INVENTION

The invention is embodied in a coil antenna for radiating RF power supplied by an RF source into a vacuum chamber including a plurality of conductors wound about the axis of symmetry as respective concentric helices, the respective helices being laterally displaced from the axis of symmetry in generally the same manner, the respective helices being offset from one another in the direction generally of the axis of symmetry, each of the conductors being adapted from connection across a supply of RF source power.

BRIEF DESCRIPTION OF THE DRAWINGS

FIG. 8 is a perspective view of a coil antenna in accordance with a fourth embodiment of the invention having a dome shape.

FIG. 9 is a perspective view of a coil antenna in accordance with a fifth embodiment which is a variant: of the cylindrical coil antenna of FIG. 6 and the dome antenna of FIG. 8.

FIG. 10 is a perspective view of a coil antenna in accordance with a sixth embodiment having a truncated dome shape overlying a truncated dome-shaped ceiling of a plasma reactor.

FIG. 11 is a perspective view of a coil antenna in accordance with a seventh embodiment having a truncated dome-shaped portion overlying a truncated dome-shaped reactor ceiling and a cylindrical portion surrounding the reactor side wall.

FIG. 12 is a perspective view of an embodiment of the invention having a truncated dome ceiling forming a chamfered corner along the circumference of the ceiling.

FIG. 13 is a perspective view of a variation of the embodiment of FIG. 12 including a cylindrical winding.

FIG. 14 is a perspective view of an embodiment of the invention having a shallow or partial dome-shaped ceiling.

FIG. 15 is a perspective view of a variation of the embodiment of FIG. 14 including a cylindrical winding.

FIG. 16 is a perspective view of an embodiment of the invention having a shallow dome-shaped ceiling with a chamfered corner along its circumference.

FIG. 17 is a perspective view of a variation of the embodiment of FIG. 16 including a cylindrical winding.

DETAILED DESCRIPTION OF THE PREFERRED EMBODIMENTS

Figure 2:
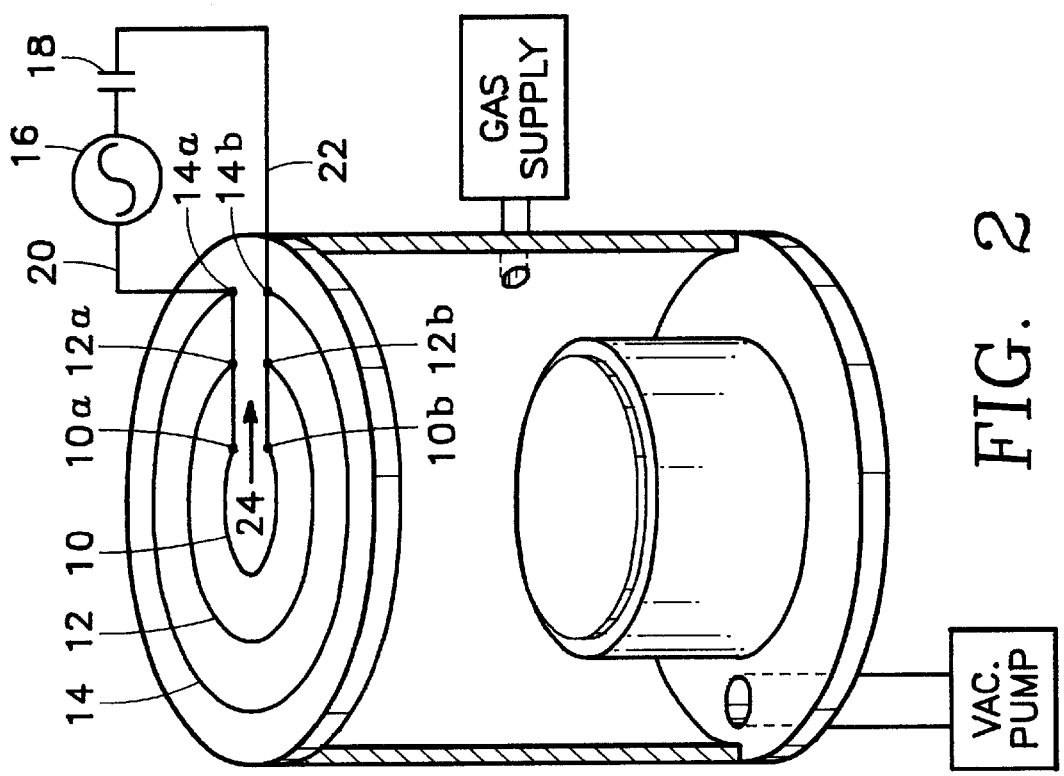
FIG. 2 is a simplified diagram of a coil antenna-having its windings connected in parallel across an RF source.

In an inductively coupled plasma reactor having an RF antenna coil adjacent the reactor chamber, it is a goal of the invention to reduce the voltage on the coil. One possible approach to reduce coil voltage is to reduce the amount of inductance in the winding of the coil antenna. This would reduce the potential V across each winding (since V=L di/dt, where L is the winding inductance and i is the winding current), this reduction in electric potential reducing capacitive coupling to the plasma. FIG. 2 illustrates one way of accomplishing this by connecting all of the coil windings 10, 12, 14 in parallel across the RF-power source 16, 18 via conductors 20, 22. One end 10a, 12a, 14a of each winding is connected to the conductor 20 while the other end 10b, 12b, 14b is connected to the other conductor 22. The problem is that the gap 24 between the conductors 20, 22 gives rise to a discontinuity in the RF field. Thus, for example, in a plasma etch reactor employing the coiled antenna of FIG. 2, the discontinuity of the coil can often cause azimuthal asymmetry in the plasma density across the wafer surface. Accordingly, the coil antenna of FIG. 2 does not provide a uniform plasma density and therefore does not fulfill the need.

Figure 3A:
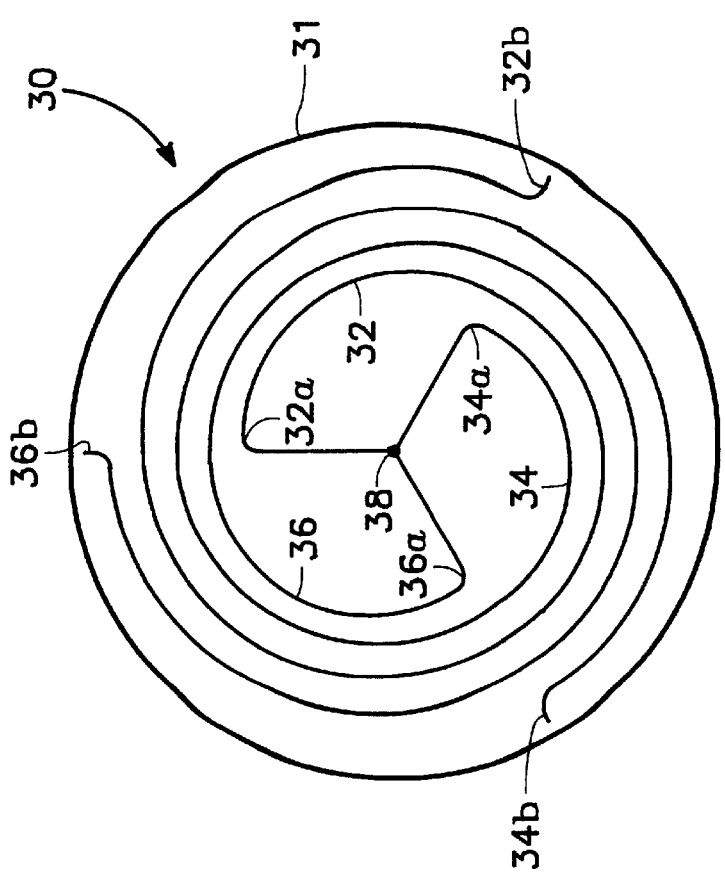
FIG. 3A is a top view of a flat disk coil antenna for a plasma reactor in accordance with a first embodiment of the invention.
Figure 4:
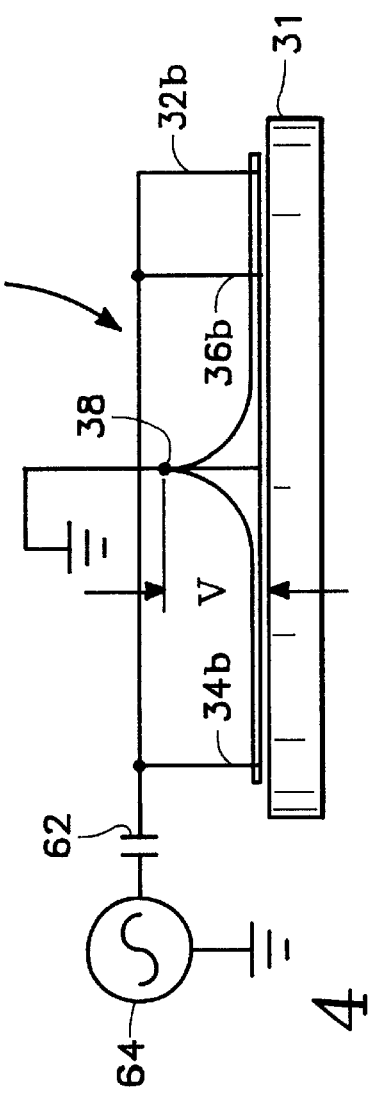
FIG. 4 is a side view corresponding to FIG. 3A.
Figure 3B:
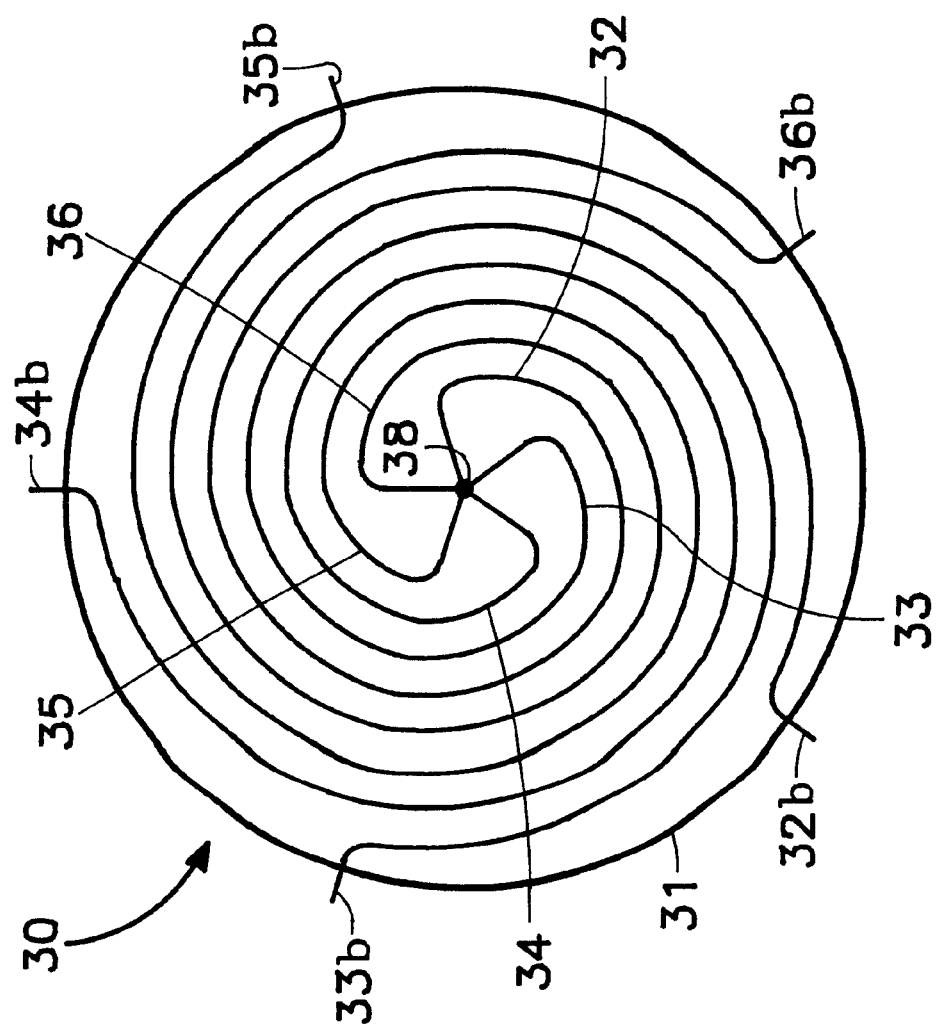
FIG. 3B is a top view of a flat disk coil antenna corresponding to FIG. 3A but having a greater number of windings.

Referring to FIGS. 3A and 4, a coil antenna 30 overlies the ceiling of a reactor chamber 31, the coil antenna 30 having plural concentric spiral windings 32, 34, 36 connected in parallel across a capacitor 62 and an RF source 64. The windings 32, 34, 36 have inner ends 32a, 34a, 36a near the center of the spirals and outer ends 32b, 34b, 36b at the peripheries of the spirals. The inner ends 32a, 34a, 36a are connected together at a common apex terminal 38. In the preferred embodiment, the common apex terminal 38 is connected to ground while the outer winding ends 32b, 34b, 36b are connected to the RF source 64. As shown in FIG. 4, the straight central inner arms of the windings 32, 34, 36 preferably wick vertically upwardly away from the reactor top to the apex terminal 38 by a vertical distance v of about 2 cm. FIG. 3B illustrates a 5-winding version of the coil antenna of FIG. 3A, including concentric windings 32, 33, 34, 35, 36 with inner endings 32a, 33a, 34, 35a, 36a and outer endings 32b, 33b, 34b, 35b, 36b.

Figure 5:
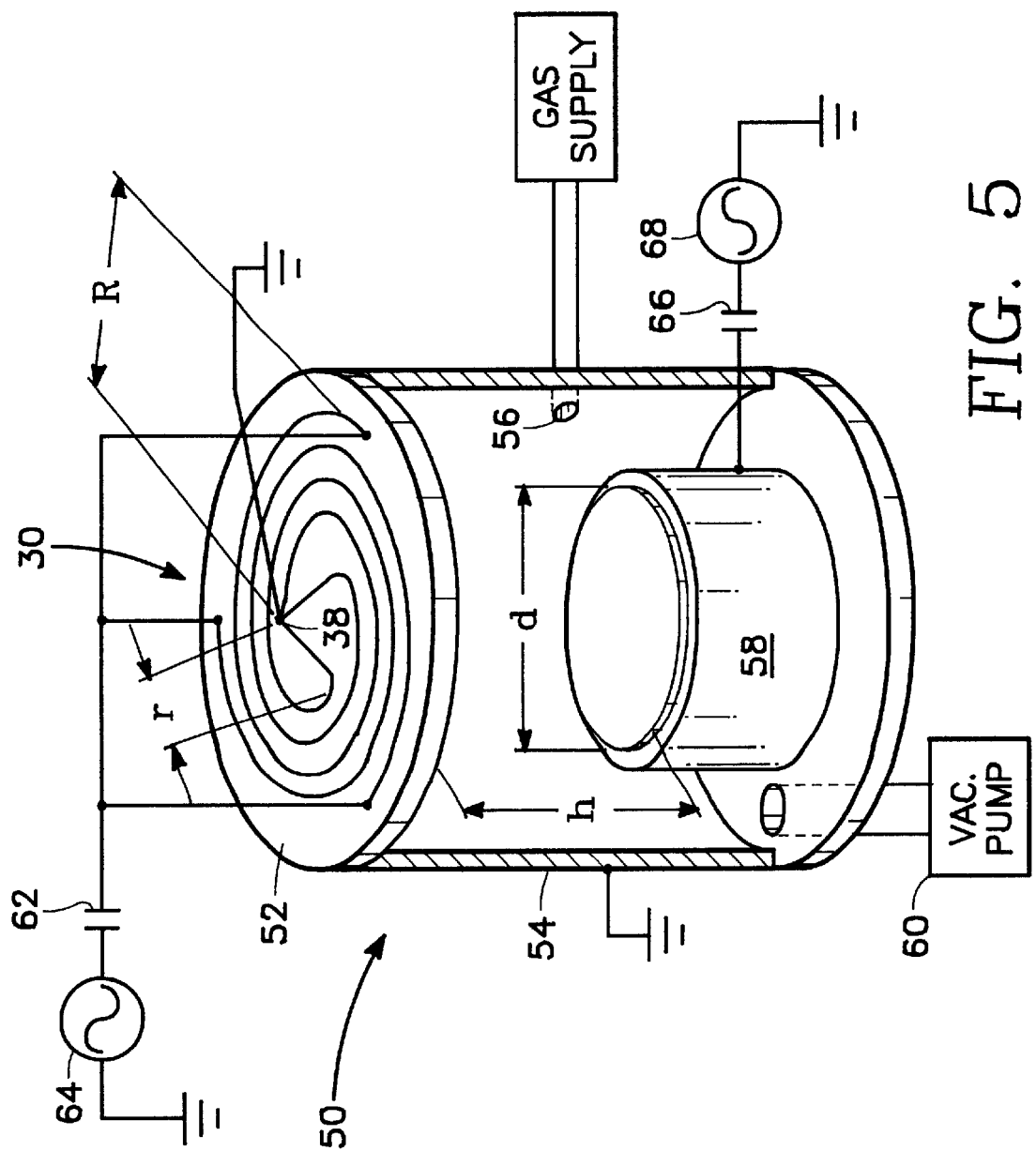
FIG. 5 is a perspective cut-away view of an inductively coupled plasma reactor employing the coiled antenna of the embodiment of FIG. 3A.

FIG. 5 illustrates an inductively coupled plasma reactor including a cylindrical vacuum chamber 50 having a flat disk insulating ceiling 52, a grounded conductive cylindrical side wall 54, a gas supply inlet 56 and a wafer pedestal 58. A vacuum pump 60 pumps gas out of the vacuum chamber. The coil antenna 30 of FIG. 3A rests on the ceiling 52. An RF power source 64 applies power through the capacitor 62 to the outer winding ends 32, 34, 36 while the common terminal 38 is grounded. A bias RF power source 66, 68 is connected to the wafer pedestal 58 to control ion kinetic energy.

In a preferred implementation of the embodiment of FIG. 5, the circular windings become straight radial arms terminating in the apex terminal 38, the arms extending along a radius r (FIG. 5) of about 2.5 cm. The outermost one of the windings 32, 34, 36 has a radius R (FIG. 5) of about 35 cm in those cases in which the wafer diameter d (FIG. 5) is about 20 cm. The height h (FIG. 5) of the coil antenna above the wafer is preferably about 5.0 cm to 7.5 cm. Preferably, each one of the coil windings 32, 34, 36 makes 1.5 turns. The number of windings per length of radius, which in the embodiment of FIG. 5 is 1.5/26 cm⁻, may be changed so as to desirably adjust the plasma density distribution across the wafer surface.

Figure 7:
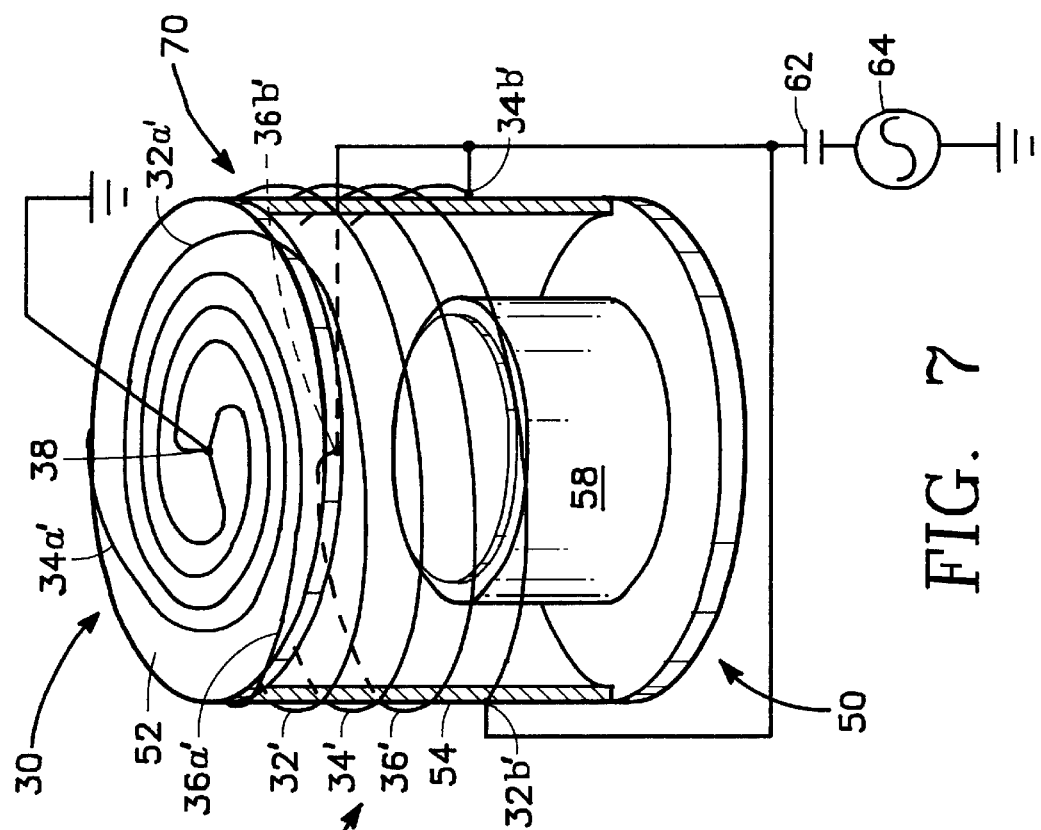
FIG. 7 is a perspective view of a coil antenna in accordance with a third embodiment of the invention which is a variant of the cylindrical coil antenna of FIG. 6 in that the cylindrical coil is continued over the ceiling of the reactor.
Figure 6:
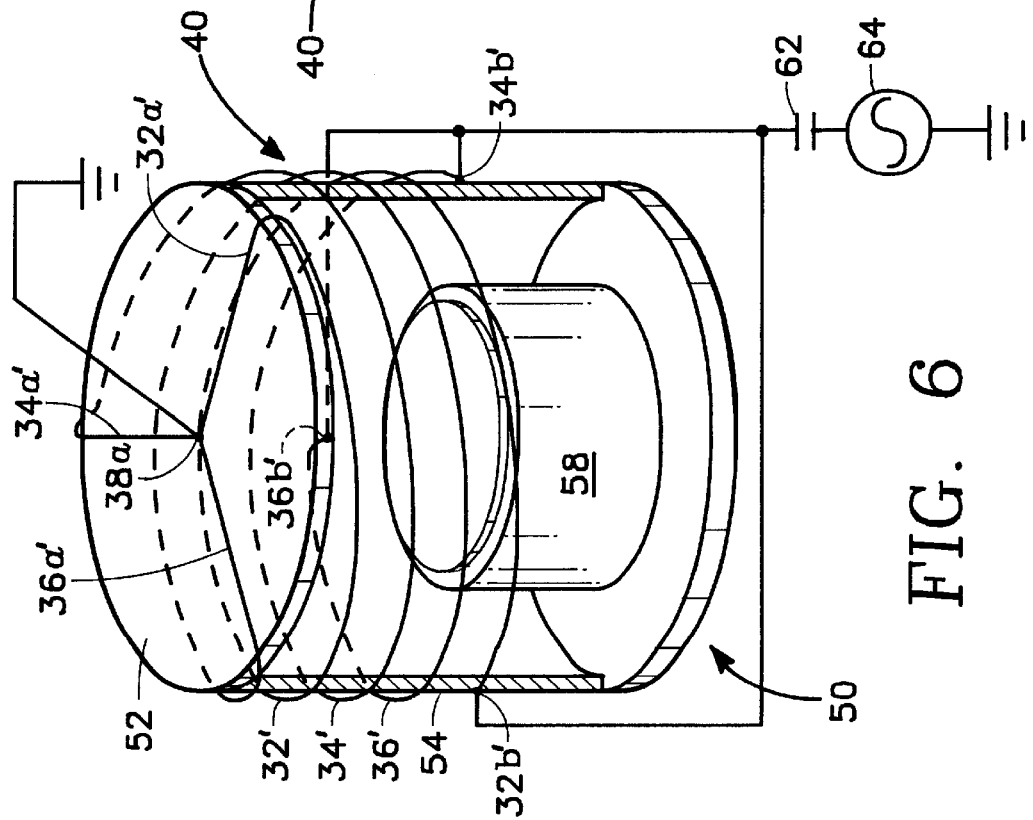
FIG. 6 is a perspective view of a cylindrical coil antenna in accordance with a second embodiment of the invention.

FIG. 6 illustrates a cylindrical version 60 of the coil antenna 30 of FIG. 3A, which also has plural concentric spiral windings 32', 34', 36' each wrapped around an insulating portion of the cylindrical side wall 54 of the reactor of FIG. 5. The plural concentric windings 32', 34', 36' have respective inner ends 32a', 34', 36a' terminating in a common apex terminal 38a, as well as outer ends 32b', 34b', 36b' terminating equidistantly from each other at locations about the lower sidewall of the reactor chamber. FIG. 7 illustrates another version of the cylindrical antenna 60, in which inner ends 32a', 34a', 36a' of the antenna 60 continue in spiral fashion across the top of the reactor in a form much as in FIG. 5 to the common apex terminal 38b, thus forming a continuous single cylindrical coil antenna 70 extending not only over portions of the cylindrical wall 54 but also over the ceiling 52 of the reactor. Preferably, each winding 32', 34', 36' makes a smooth transition at the corner between the ceiling and the cylindrical sidewall, in the manner illustrated in the drawing.

FIG. 8 illustrates a dome-shaped version 80 of the coil antenna 30 of FIG. 3A for use with a version of the reactor of FIG. 5 in which the ceiling 52 is dome-shaped. FIG. 9 illustrates how the dome-shaped coil antenna 80 may be integrated with the cylindrical shaped coil antenna 60 to form a single antenna 90 covering both the dome-shaped ceiling and cylindrical side wall of the reactor of the embodiment of FIG. 8. The windings make a smooth transition from the dome-shaped ceiling to the cylindrical sidewall in the manner illustrated in the drawing. FIG. 10 illustrates a modification of the coil 80 of FIG. 8 in which the dome-shaped ceiling is truncated so as to have a flattened apex. FIG. 11 illustrates a modification of the coil of FIG. 9 in which the dome-shaped ceiling is truncated so as to have a flattened apex.

The windings 32, 34, 36 are spaced from one another by a sufficient spacing to prevent arcing therebetween. In order to provide an azimuthal symmetrical RF power feeding and minimum potential difference between adjacent winding along the entire lengths thereof, all windings 32, 34, 36 preferably are of the same length. In the illustrated embodiments, the spacings between windings are equal and are uniform throughout the antenna coil. However, the invention may be modified by varying the winding-towinding spacings so as to be different at different locations or to differ as between different pairs of windings.

While the invention has been described with reference to preferred embodiments having three concentric spiral windings 32, 34, 36, other embodiments of the invention may be made with as few as two such windings, four such windings or any desired number of windings, provided the requisite winding-to-winding spacing is maintained to avoid arcing. A greater number of spiral windings provides a more uniform RF field and in some cases more uniform plasma ion density across the wafer surface.

FIG. 12 illustrates a variation of the embodiment of FIG. 10 in which the ceiling 52 has a central flat region 52a surrounded by an annular chamfer 52b which provides a smooth transition from the horizontal flat region 52a to the vertical side wall 54. This in turn helps the windings 32, 33, 34, 35, 36 make a smooth transition as well. An annular portion of the coil antenna overlies and conforms with the corner chamfer. Furthermore, the embodiment of FIG. 12 has five concentric windings 32, 33, 34, 35, 36 with outer ends 32b, 33b, 34b, 35b, 36. FIG. 13 illustrates a variation of the embodiment of FIG. 12 in which concentric windings 32', 33', 34', 35', 36' make a smooth transition at the corner chamfer from the flat portion of the ceiling 52 to the cylindrical side wall, each of these windings including a first portion overlying the flattened central part 52a of the ceiling 52, a second portion overlying the corner chamfer 52b of the ceiling 52 and a third portion wrapped around the cylindrical side wall 54. The winding outer ends 32b', 33b', 34b', 35b', 36b' defining the bottom of the coil antenna are disposed at about the same height as the top of the wafer pedestal 58 and are connected to the output terminal of the RF source through the capacitor 62. The pitch of the windings may vary with location so that, as one example, the windings on the top may be at one pitch while the winding along the cylindrical side wall may be at a different pitch, thus providing greater control over the plasma formation.

FIG. 14 illustrates a variation of the embodiment of FIG. 12 having flattened dome-shaped ceiling, whose arc subtends an angle substantially less than 180 degrees, for example about 90 degrees. In contrast, for example, the dome-shaped ceiling of FIG. 10 subtends approximately 180 degrees of arc. FIG. 15 illustrates a variation of the embodiment of FIG. 13 also having flattened dome-shaped ceiling, whose arc subtends an angle substantially less than 180 degrees, for example about 90 degrees.

FIG. 16 illustrates an embodiment combining a flattened central dome 52a' like that of FIG. 14 with an outer corner chamfer 52b' like that of FIG. 12. FIG. 17 illustrates a variation of the embodiment of FIG. 16 in which the windings make a smooth transition at the corner chamfer 52b from the ceiling 52 to the cylindrical side wall 54. The embodiments concentric windings 32, 33, 34, 35, 36 with outer ends 32b, 33b, 34b, 35b, 36. FIG. 13 illustrates a variation of the embodiment of FIG. 12 in which concentric windings 32', 33', 34', 35', 36' make a smooth transition at the corner chamfer from the flat portion of the ceiling 52 to the cylindrical side wall, each of these windings including a first portion overlying the flattened central part 52a of the ceiling 52, a second portion overlying the corner chamfer 52b of the ceiling 52 and a third portion wrapped around the cylindrical side wall 54. The winding outer ends 32b', 33b', 34b', 35b', 36b' defining the bottom of the coil antenna are disposed at about the same height as the top of the wafer pedestal 58 and are connected to the output terminal of the RF source through the capacitor 62. The pitch of the windings may vary with location so that, as one example, the windings on the top may be at one pitch while the winding along the cylindrical side wall may be at a different pitch, thus providing greater control over the plasma formation.

FIG. 14 illustrates a variation of the embodiment of FIG. 12 having flattened dome-shaped ceiling, whose arc subtends an angle substantially less than 180 degrees, for example about 90 degrees. In contrast, for example, the dome-shaped ceiling of FIG. 10 subtends approximately 180 degrees of arc. FIG. 15 illustrates a variation of the embodiment of FIG. 13 also having flattened dome-shaped ceiling, whose arc subtends an angle substantially less than 180 degrees, for example about 90 degrees.

FIG. 16 illustrates an embodiment combining a flattened central dome 52a' like that of FIG. 14 with an outer corner chamfer 52b' like that of FIG. 12. FIG. 17 illustrates a variation of the embodiment of FIG. 16 in which the windings make a smooth transition at the corner chamfer 52b from the ceiling 52 to the cylindrical side wall 54. The embodiments of FIGS. 12–17 are illustrated as having 5 concentric windings each, in contrast with the 3 concentric windings of the embodiments of FIGS. 3–11. The invention can be implemented with any suitable number of concentric windings.

ADVANTAGES OF THE INVENTION

The parallel arrangement of the windings 32, 34, 36 of the coil antenna 30 of FIG. 3A reduces the potential across each winding, as compared to, for example, using only one winding, and therefore reduces the capacitive coupling (as explained above with reference to the example of FIG. 2). In addition, the coil antenna of FIG. 3A provides uniform plasma density over the wafer, as compared previous techniques for example, as there are no discontinuities of the type discussed above with reference to the example of FIG. 2 (e.g., in the RF field). Such improved uniformity is not limited to etch applications, but is also realized when the invention is used in other plasma-assisted processes, such as chemical and physical vapor deposition of coatings. Further, as compared to prior art FIG. 1, not only is the potential across each winding reduced, but also the current flowing in the parallel windings of the invention is spatially distributed over the reaction volume in a much more uniform fashion.

Preferably, each of the windings 32, 34, 36 have the same length and their outer ends 32b, 34b, 36b terminate at points equidistant from each other about a circularly symmetric reaction chamber, further enhancing uniformity. Preferably, the winding inner ends 32a, 34a, 36a terminate at the geometric center of the coil antenna because the apex is located at the geometric center of the coil, which preferably has geometric circular symmetry. Preferably also, this geometric antenna center is made to coincide with the axis of symmetry of a circularly symmetric reactor chamber. Also, the winding inner ends 32, 34a, 36a are preferably spaced equidistantly away from each other for a limited radial distance as they approach the apex terminal 38a. Further, the windings are spaced from each other as uniformly as possible at least in flat configurations of the invention such as the embodiment of FIG. 3A; while in non-flat configurations such as the embodiment of FIG. 8, smoother variations and spacings with radius from the geometrical center may be made to compensate for chamber geometry.

Figure 1:
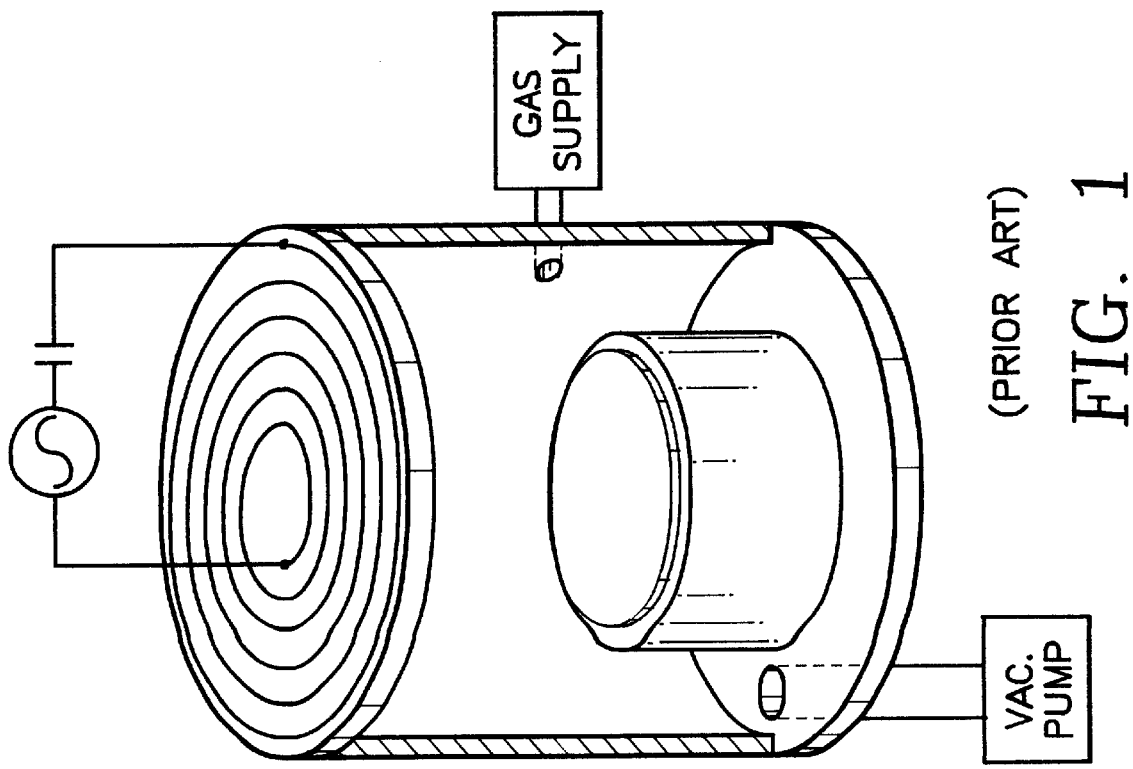
FIG. 1 is a simplified diagram of a coiled antenna for an inductively coupled plasma reactor of the prior art.

As a result, the RF power applied to the coil antenna of FIG. 3A need not be limited as in the case of the coil antenna of FIG. 1. Indeed, the coil antenna of FIG. 3A can operate with 3000 Watts of RF power at 13.56 MHz, while the coil antenna of FIG. 1 must be limited to about 300 watts to prevent failures due to the non-uniform field coverage. The increase in RF power afforded by the coil antenna of FIG. 3A provides higher etch rates in a plasma etch reactor, higher deposition rates in a chemical vapor deposition reactor. Thus, the invention not only provides greater processing uniformity across the wafer surface but also provides greater throughput or productivity.

Figure 18:
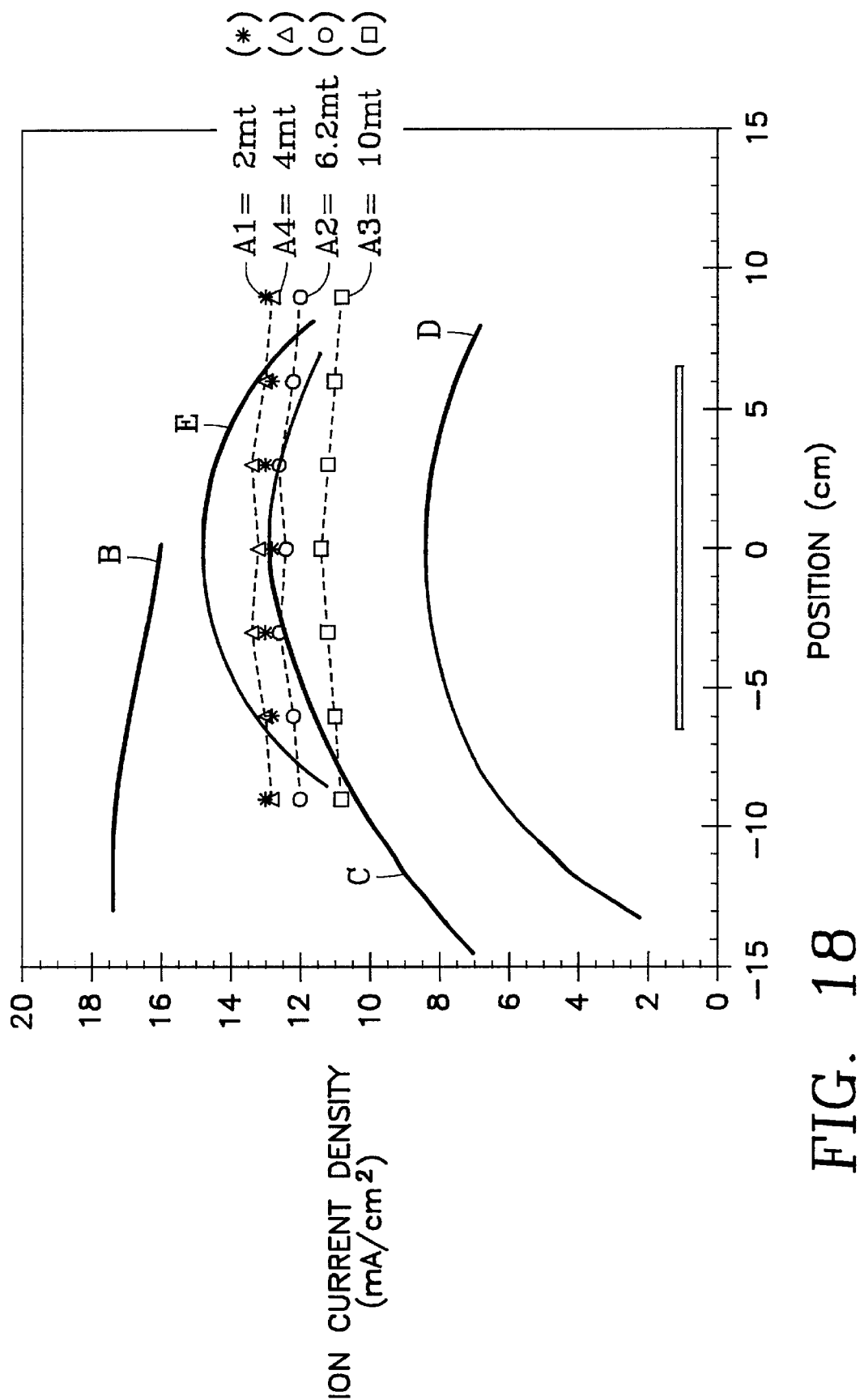
FIG. 18 contains superimposed graphs of ion current measured at the wafer surface as a function of radial position from the wafer center for various types of reactors of the prior art and corresponding graphs for a reactor incorporating the present invention.

The invention provides a greater uniformity of ion density across the wafer surface, a significant advantage. This is illustrated in the superimposed graphs of FIG. 18. The curves in FIG. 18 labelled A1, A2, A3 and A4 represent measurements of ion current at the wafer surface in milli-Amperes per square centimeter as a function of distance from the wafer center-in centimeters for a reactor employing the coil antenna of the invention depicted in FIG. 3A with a reactor chamber supplied with chlorine gas at an applied RF power level of 2000 Watts on the antenna coil, no RF bias power applied and the chamber maintained at a pressure of 2 milliTorr, 6.2 milliTorr, 10 milliTorr and 4 milliTorr, respectively. The smallest deviation in ion density, namely 2% in the curve labelled A1, is obtained at 2 milliTorr. The uniformity percentage represents the change in current density (vertical axis) across the wafer divided by two times the average current density in that range. In contrast, a reactor sold by manufacturer #1, whose performance is depicted by the curve labelled B in FIG. 18, had a deviation in plasma ion density of 4.5% across the wafer surface at the same applied RF power level and no RF bias power applied and a mixture of 50 parts of chlorine and 20 parts helium. A reactor sold by manufacturer #2, whose performance is depicted by the curve labelled C in FIG. 18, had a deviation in plasma ion density of 9% under similar conditions. A reactor sold by manufacturer #3, whose performance is depicted by the curve labelled D in FIG. 18 had a deviation of 11% in plasma ion density across the wafer surface. A reactor sold by manufacturer #4, whose performance is depicted by the curve labelled E in FIG. 18, had a deviation in plasma ion density across the wafer surface of 26% at an applied power level of 900 Watts on the antenna coil. The foregoing data is summarized in the following table:

TABLE I

| Plasma Reactor | Ion Current (mA/cm$^2$) | Applied Power (Watts) | Pressure (mTorr) | Gas | Ion Density Deviation |
|---|---|---|---|---|---|
| Invention | 12.8 | 2000 | 2 | Cl | 2% |
| Manufacturer #1 | 17 | 2000 | 1.2 | 50 Cl/20 He | 4.5% |
| Manufacturer #2 | 11.4 | 2000 | 2 | Cl | 9% |
| Manufacturer #3 | 7.6 | 1450 | 2 | Cl | 11% |
| Manufacturer #4 | 11.5 | 900 | 5 | Cl | 26% |

Figure 19:
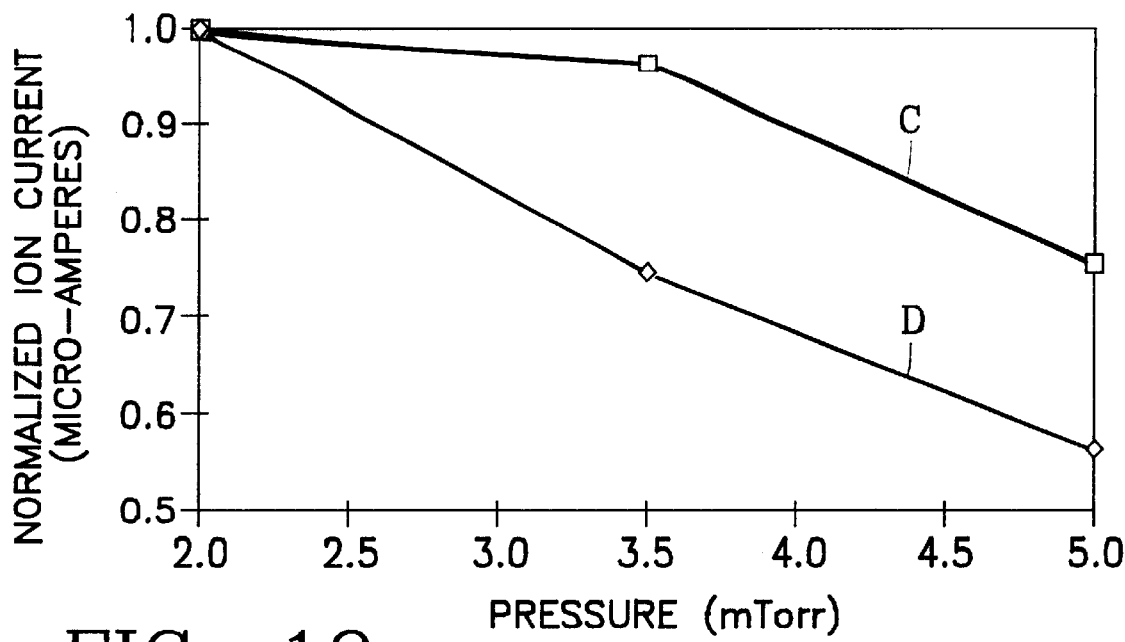
FIG. 19 contains superimposed graphs of ion current measured at the wafer surface as a function of reactor chamber pressure for different reactors of the prior art.
Figure 20:
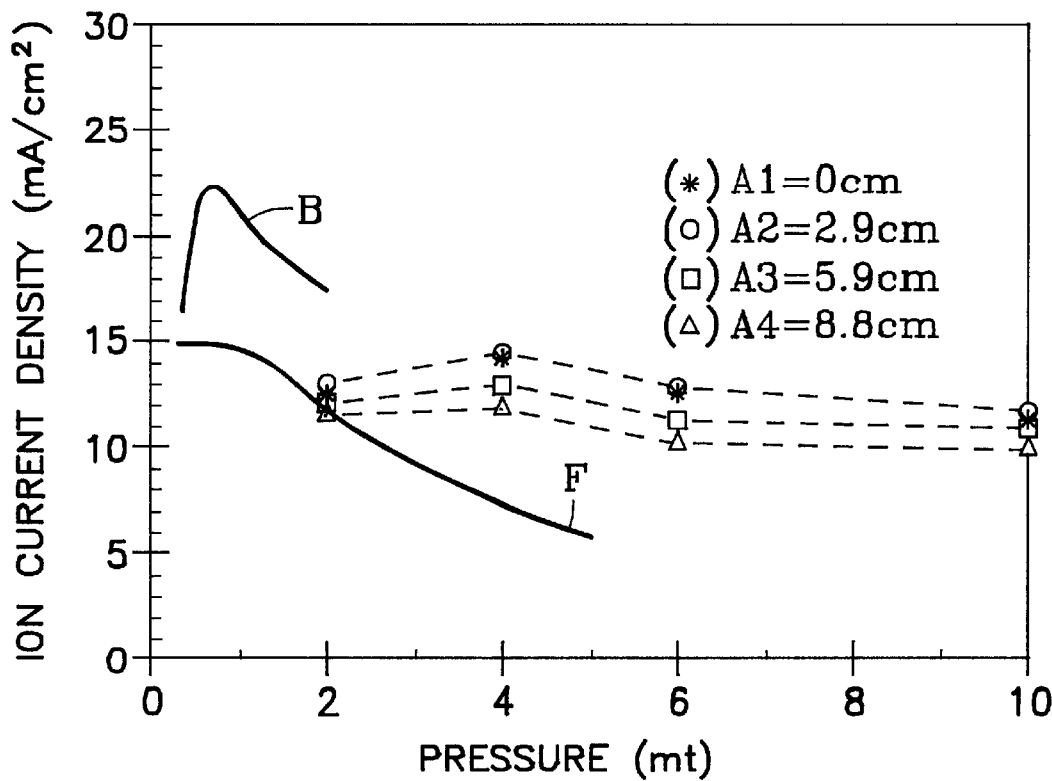
FIG. 20 contains superimposed graphs of ion current measured at the wafer surface as a function of reactor chamber pressure for different reactors of the prior art and corresponding graphs for a reactor incorporating the present invention.
Figure 21:
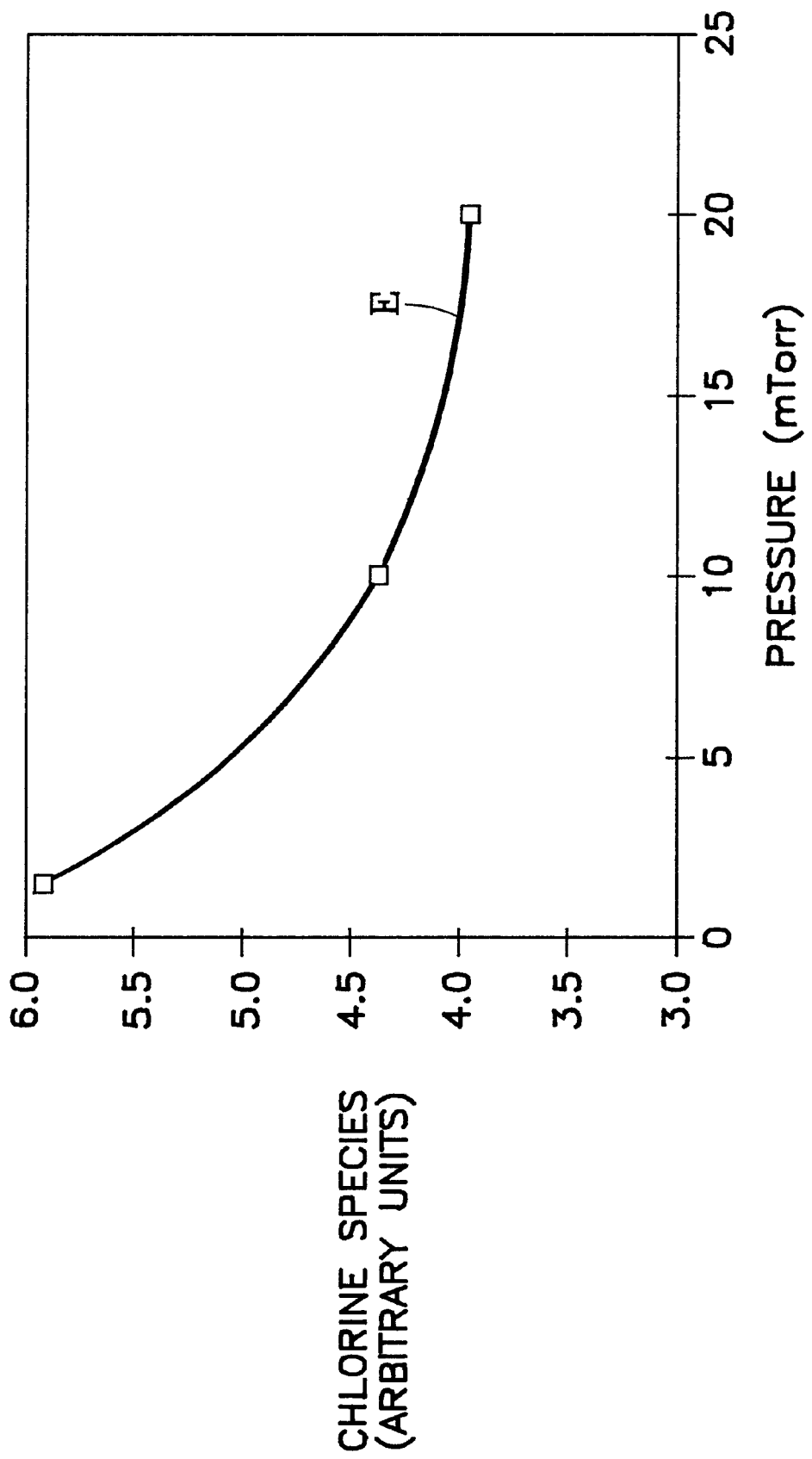
FIG. 21 contains superimposed graphs of ion current measured at the wafer surface as a function of reactor chamber pressure for different reactors of the prior art.

The invention provides a greater stability of ion density over a large range of chamber pressures, a significant advantage. The performance of two plasma reactors of the prior art sold by manufacturers #2 and #3 are depicted by the superimposed curves labelled C and D, respectively, in FIG. 19. The vertical axis is a normalized measured ion current at the wafer surface while the horizontal axis is the chamber pressure in milliTorr. The manufacturer #2 plasma reactor (curve C) has a deviation of 23% in ion current over a pressure range from 2 to 5 milliTorr. The manufacturer #3 reactor (curve D) has a deviation of 40% in ion current over the same pressure range. The performance of the invention in accordance with FIG. 3A and of other prior art reactors is depicted in the superimposed graphs of FIG. 20. The curves labelled A1, A2, A3 and A4 depict the ion current measured at the wafer surface in the reactor of the invention at distances of 0 cm, 2.9 cm, 5.9 cm and 8.8 cm, respectively, from the wafer center. These curves show that the deviation in ion density using a reactor of the invention is no more than 10% across the same pressure range. The reactor sold by manufacturer #1, whose performance is depicted by the curve labelled B in FIG. 20, had a deviation of 22% across a much narrower pressure range. A reactor sold by manufacturer #5, whose performance is depicted by the curve labelled F in FIG. 20, had a deviation in ion density of 45 across a similar pressure range (2–5 milliTorr). The reactor sold by manufacturer #4, whose performance is depicted by the curve labelled E in FIG. 21, had a deviation in ion density of 25% across the narrower pressure range of 0.5 to 2.0 milliTorr. The foregoing experimental measurements relating to stability of ion density over change in chamber pressure are summarized in the following table:

TABLE II

| Plasma Reactor | Ion Current (mA/cm$^2$) | Applied Power (Watts) | Pressure (mTorr) | Gas | Ion Density Deviation |
|---|---|---|---|---|---|
| Invention | 10 | 2000 | 2–10 | Cl | 10% |
| Manufacturer #1 | 17 | 2000 | .7–2 | 50 Cl/20 He | 22% |
| Manufacturer #2 | 11.4 | 2500 | 2–5 | Cl | 23% |
| Manufacturer #3 | 7.6 | 1000 | 2–5 | Cl | 40% |
| Manufacturer #4 | 11.5 | 300 W (source) 30 W (bias) | 2–10 | Cl | 25% |
| Manufacturer #5 | 15 | 1000 | 2–5 | N | 45% |

The foregoing experimental data show that the invention provides a stability in ion density over changes in pressure over twice that of the best reactors of the prior art: and at least four times that of other reactors of the prior art.

While the invention has been described in detail by specific reference to preferred embodiments, it is understood that variations and modifications may be made without departing from the true spirit and scope of the invention.

What is claimed is:

1. A coil antenna for radiating RF power into a vacuum chamber, comprising:
   a plurality of conductors wound about the axis of symmetry as respective concentric helices, each of said conductors being adapted for connection across a supply of RF source power, said conductors each having generally coplanar first ends lying in a first common region and generally coplanar second ends lying in a second common region, said first ends being rotationally offset from one another about said axis of symmetry, said second ends being rotationally offset from one another about said axis of symmetry.

2. The antenna of claim 1 wherein each one of said helices lies between a top plane and a bottom plane generally perpendicular to said axis of symmetry, the helix defined by each conductor being terminated at a top point of the conductor near said top plane and a bottom point of the conductor near said bottom plane, said RF power source being connected across said top and bottom points of each of said conductors.

3. The antenna of claim 2 wherein said top points are connected to an output terminal of said RF power source and said bottom points are grounded so as to reduce the electric potential near said ceiling.

4. The antenna of claim 2 wherein said top points are angularly displaced from one another by about 360/n, wherein n is the number of said plural conductors of the coil antenna.

5. The antenna of claim 4 wherein said bottom points are angularly displaced from one another by about 360/n, wherein n is the number of said plural conductors of the coil antenna.

6. The antenna of claim 5 wherein said top points are co-planar and lie in said top plane.

7. The antenna of claim 6 wherein said bottom points are co-planar and lie in said bottom plane.

8. The antenna of claim 2 wherein said top and bottom ends of each of said conductors are co-linear in a direction parallel to said axis of symmetry.

9. The antenna of claim 1 wherein said helices of said plural conductors are cylindrical and have the same diameter by which they are offset from axis, whereby the coil antenna defines a right cylinder.

10. The antenna of claim 1 wherein:
  each one of said respective helices defines plural concentric windings of the respective conductor separated by a winding-to-winding spacing;
  the respective helices are offset from one another in the direction generally of the axis of symmetry by a distance less than said winding-to-winding spacing.

11. The antenna of claim 10 wherein adjacent ones of the respective helices are uniformly offset along said axis of symmetry.

12. The antenna of claim 1 wherein said first ends are rotationally offset by uniform amounts of rotation and said second ends are rotationally offset by uniform amounts of rotation.

13. The antenna of claim 1 wherein said coil antenna is distributed over a plane and said first and second common regions are radially inner and outer regions, respectively.

14. The antenna of claim 13 wherein said conductors spiral radially outwardly from first region to said region.

15. The antenna of claim 13 wherein said coil antenna is one of: (a) planar, (b) dome-shaped, (c) multi-radius dome-shaped.

16. The antenna of claim 1 wherein said coil antenna is in a right vertical cylindrical shape and said first and second common spaced apart by a height of said antenna.

17. The antenna of claim 16, wherein said conductors spiral vertically downwardly from said first to said second region.

18. An RF plasma reactor for processing a workpiece, comprising:
  a vacuum chamber having a ceiling and defining an axis of symmetry;
  a workpiece support pedestal within the chamber;
  a coil antenna having a preferred region of radius and overlying a peripheral region of the ceiling, the coil antenna including a plurality of conductors wound about said axis in respective concentric helical solenoids, each adapted to accept RF power, said conductors each having generally coplanar first ends lying in a first common region and generally coplanar second ends lying in a second common region, said first ends being rotationally offset from one another about said first axis of symmetry, said second ends being rotationally offset from one another about said axis of symmetry.

19. The apparatus of claim 18 wherein the conductors of each antenna are generally parallel to each other.

20. The apparatus of claim 18 wherein said conductors spiral axially from a top planar region to a bottom planar region.

21. The apparatus of claim 18 wherein each helical solenoid is offset with respect to the other in the direction of the axis.

22. The apparatus of claim 18 wherein each helical solenoid is offset with respect to the other by a distance less than the distance between adjacent windings of each helical solenoid.

23. The apparatus of claim 18 wherein the conductors of each helical solenoid are of generally the same length and of substantially the same shape.

24. The apparatus of claim 18 further comprising an RF power source connected across each of said conductors.

25. The apparatus of claim 18 wherein the conductors of each helical solenoid each define first and second ends, each of said first ends and said second ends being azimuthally substantially equally spaced from each other.

* * * * *